(12) United States Patent
Furukawa

(10) Patent No.: US 7,859,288 B2
(45) Date of Patent: Dec. 28, 2010

(54) TEST APPARATUS AND TEST METHOD FOR TESTING A DEVICE BASED ON QUIESCENT CURRENT

(75) Inventor: Yasuo Furukawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 133 days.

(21) Appl. No.: 12/209,213

(22) Filed: Sep. 12, 2008

(65) Prior Publication Data

US 2010/0066403 A1      Mar. 18, 2010

(51) Int. Cl.
 *G01R 31/26* (2006.01)
(52) U.S. Cl. .................. 324/765; 324/158.1; 324/763
(58) Field of Classification Search .................. None
See application file for complete search history.

(56) References Cited

U.S. PATENT DOCUMENTS

| | | | |
|---|---|---|---|
| 5,481,551 A * | 1/1996 | Nakano et al. | 714/740 |
| 6,366,108 B2 * | 4/2002 | O'Neill et al. | 324/763 |
| 6,593,765 B1 * | 7/2003 | Ishida et al. | 324/765 |
| 6,992,497 B2 * | 1/2006 | Furukawa et al. | 324/765 |

FOREIGN PATENT DOCUMENTS

| | | |
|---|---|---|
| JP | 10-332775 | 12/1998 |
| JP | 2000-171529 | 6/2000 |
| JP | 2004-219115 | 8/2004 |
| JP | 2006317208 | 11/2006 |
| WO | 2006041064 | 4/2006 |

OTHER PUBLICATIONS

"Search Report of PCT counterpart application", issued on Dec. 22, 2009, p. 1-p. 11.

* cited by examiner

*Primary Examiner*—Vinh P Nguyen
(74) *Attorney, Agent, or Firm*—Osha Liang LLP

(57) ABSTRACT

Provided is A test apparatus that tests a device under test, including a power supply section that supplies power to a power supply terminal of the device under test; a power supply control section that controls the power supply section to output the power at a plurality of voltage levels; a current measuring section that measures, at each voltage level, a current value of a quiescent current of the device under test, the quiescent current being supplied to the power supply terminal of the device under test by the power supply section; and an analyzing section that analyzes whether a defect is present in the device under test by using at least three current values from among the current values measured by the current measuring section at the plurality of voltage levels.

7 Claims, 2 Drawing Sheets

TEST APPARATUS AND TEST METHOD FOR TESTING A DEVICE BASED ON QUIESCENT CURRENT

BACKGROUND

1. Technical Field

The present invention relates to a test apparatus and a test method for testing a device under test such as an electronic device.

2. Related Art

Japanese Patent Application Publication No. 2006-317208 discloses a test apparatus that judges whether a device under test is defective based on a quiescent power supply current of the device under test. The test apparatus includes (i) a power supply that supplies the device under test with a driving power, (ii) a pattern generating section that supplies the device under test with a setting vector that sets a circuit of the device under test to a prescribed state, (iii) a power supply current measuring section that measures the quiescent power supply current supplied from the power supply to the device under test when the device under test is set to the prescribed state by the setting vector, and (iv) a judging section that acquires a temperature of the device under test using an internal temperature sensor and judges whether the device under test is defective based on the temperature of the device under test and the quiescent power supply current measured by the power supply current measuring section.

The defectiveness judgment based on the quiescent current IDDQ of the device under test uses the fact that a CMOSFET (Complementary Metal Oxide Semiconductor Field Effect Transistor) consumes almost no power when at rest, in other words, when the power supply current is not flowing. If a very small number of defective elements are present in a block under test, an excess current flows on the line supplying power to this block, so that a defect can be easily detected. Since recent advances in miniaturization of semiconductor devices have caused various types of defective modes, more complicated test patterns are used in function testing, and testing coverage is reduced. Taking this into account, a defectiveness judgment based on the IDDQ that can easily detect a wide range of defects is combined with other test methods to achieve an effective test method that can efficiently enhance test coverage.

However, miniaturization of the elements causes an internal leak current, even if the element is working normally. This makes it difficult to distinguish between a current flowing through a defective device under test and a current flowing through a non-defective device under test. Accordingly, a method for testing the IDDQ is sought that can distinguish between a normal current and an abnormal current to achieve a highly accurate defectiveness judgment, even if the miniaturization causes a leak current in the element.

SUMMARY

Therefore, it is an object of an aspect of the innovations herein to provide a test apparatus and a test method, which is capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, including a power supply section that supplies power to a power supply terminal of the device under test; a power supply control section that controls the power supply section to output the power at a plurality of voltage levels; a current measuring section that measures, at each voltage level, a current value of a quiescent current of the device under test, the quiescent current being supplied to the power supply terminal of the device under test by the power supply section; and an analyzing section that analyzes whether a defect is present in the device under test by using at least three current values from among the current values measured by the current measuring section at the plurality of voltage levels.

The analyzing section may obtain a resistance value related to the defect based on a quiescent current expression including (i) a first current term whose value increases exponentially in relation to an applied voltage, and (ii) a second current term whose value increases proportionally with the applied voltage, the quiescent current expression representing the quiescent current supplied to the power supply terminal. The analyzing section may obtain the resistance value from a relational expression by using three expressions to eliminate the first current term, the three expressions being (i) a first expression in which a first current value corresponding to a first voltage level is substituted for the quiescent current expression, (ii) a second expression in which a second current value corresponding to a second voltage level is substituted for the quiescent current expression, and (iii) a third expression in which a third current value corresponding to a third voltage level is substituted for the quiescent current expression. The test apparatus may further include a pattern generating section that generates a pattern supplied to the device under test, and the current measuring section may measure the quiescent current at each voltage level while the device under test is being supplied with the pattern generated by the pattern generating section. The pattern generating section may generate a plurality of the patterns, and the current measuring section may measure the quiescent current for each of the plurality of patterns.

According to a first aspect related to the innovations herein, one exemplary test method may include a test method for testing a device under test, including the steps of: applying a first voltage to a power supply terminal of the device under test and obtaining a first current value corresponding to the first voltage by measuring a quiescent current of the device under test supplied to the power supply terminal; applying a second voltage to the power supply terminal of the device under test and obtaining a second current value corresponding to the second voltage by measuring the quiescent current of the device under test supplied to the power supply terminal; applying a third voltage to the power supply terminal of the device under test and obtaining a third current value corresponding to the third voltage by measuring the quiescent current of the device under test supplied to the power supply terminal; and analyzing whether a defect is present in the device under test by using the first current value, the second current value, and the third current value.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
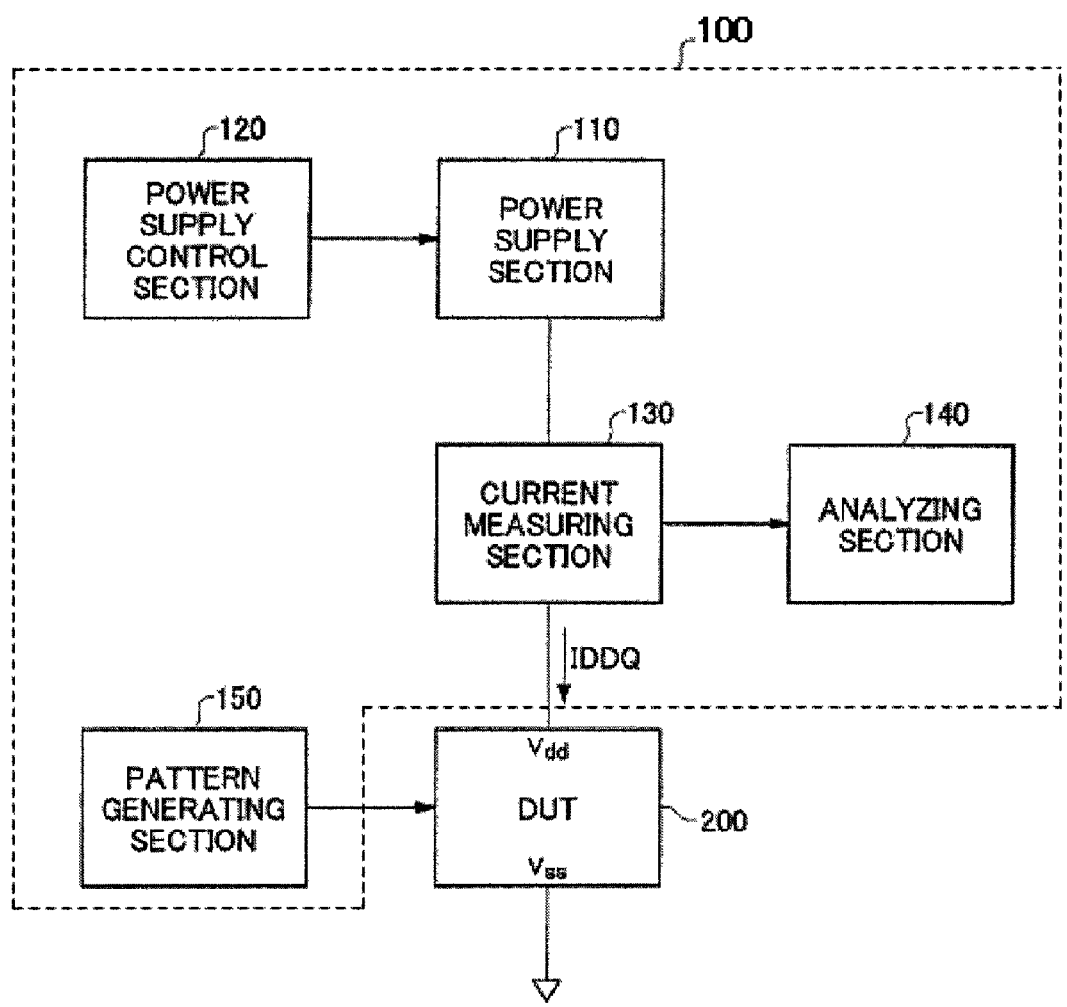
FIG. 1 shows a schematic of a test apparatus 100 according to the present embodiment, along with a device under test (DUT) 200.

FIG. 1 shows a schematic of a test apparatus 100 according to the present embodiment, along with a device under test (DUT) 200. The test apparatus 100 tests the device under test 200 by supplying a prescribed voltage to a power supply terminal of the device under test 200 and measuring the quiescent current IDDQ while the device under test 200 is not operating. The test apparatus 100 is provided with a power supply section 110, a power supply control section 120, a current measuring section 130, an analyzing section 140, and a pattern generating section 150.

The power supply section 110 supplies power, as a power supply voltage Vdd, to the power supply terminal of the device under test 200. Another power supply terminal of the device under test 200 is supplied with a voltage Vss, which may be a ground potential. The power supply control section 120 controls the power supply section 110 to output power at a plurality of voltage levels.

The current measuring section 130 measures the quiescent current IDDQ of the device under test 200 being supplied with the power supply voltage Vdd at the power supply terminal by the power supply section 110. The current measuring section 130 measures the current value, which is the quiescent current IDDQ, at each voltage level output under the control of the power supply control section 120.

The analyzing section 140 analyzes whether the device under test 200 is defective using at least three current values of the quiescent current IDDQ measured at several levels by the current measuring section 130. The analyzing section 140 obtains a resistance value related to the defect based on a quiescent current expression, which expresses the quiescent current supplied to the power supply terminal. The quiescent current expression has a first current term whose value increases exponentially in relation to the voltage applied to the power supply voltage Vdd of the power supply terminal, and a second current term whose value increases proportionally with the voltage applied to the power supply voltage Vdd of the power supply terminal. For example, the analyzing section 140 can obtain a resistance value from a relational expression obtained by calculating the following three expressions to eliminate the first current term. The three expressions are: (i) a first expression in which the first current value corresponding to the first voltage level is substituted for the quiescent current expression, (ii) a second expression in which the second current value corresponding to the second voltage level is substituted for the quiescent current expression, and (iii) a third expression in which the third current value corresponding to the third voltage level is substituted for the quiescent current expression. The quiescent current expression is described in detail below.

The pattern generating section 150 generates the pattern to be supplied to the device under test 200. The current measuring section 130 measures the quiescent current IDDQ at each voltage level while the device under test 200 is being supplied with the pattern generated by the pattern generating section 150. Since the quiescent current IDDQ usually includes a current component dependent on the pattern, the quiescent current IDDQ is preferably measured for each pattern. If the pattern generating section 150 generates a plurality of patterns, the current measuring section 130 can measure the quiescent current IDDQ for each of the plurality of patterns.

Figure 2:
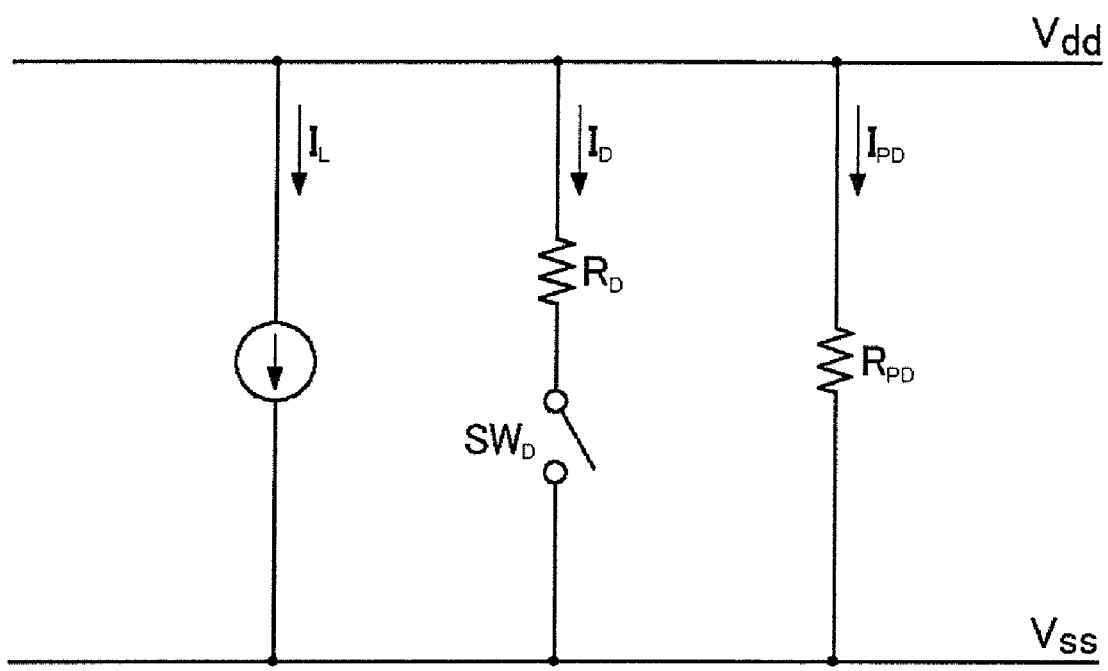
FIG. 2 shows a circuit model of a device under test 200 having a defect.

FIG. 2 shows a circuit model of a device under test 200 having a defect. The quiescent current IDDQ flows between the power supply voltage Vdd of the power supply terminal and the ground potential Vss. It is not necessary that the voltage Vss be a ground potential. The quiescent current IDDQ includes three current components. These three current components are: a normal current $I_L$ that flows when no defect is present, a pattern-dependent defect current $I_D$ that flows through a defect dependent on the pattern, and a passive defect current $I_{PD}$ that flows through a passive defect.

The normal current $I_L$ is usually a constant current that does not depend on Vdd, and is therefore considered to be a conventional constant current source. However, as further miniaturization is achieved, the normal current $I_L$ changes depending on the power supply voltage Vdd. Therefore, the normal current $I_L$ in FIG. 2 is expressed as a constant current source just for ease of explanation, and is not limited to such. The pattern-dependent defect current $I_D$ changes according to a state of a switch SWD, which corresponds to the state of the pattern, and flows as a current proportional to Vdd if the state of the pattern is unchanged. Accordingly, the pattern-dependent defect current $I_D$ is expressed by a circuit having a resistance $R_D$. The passive defect current $I_{PD}$ is also based on Vdd, and can therefore be expressed by a resistance circuit having a resistance $R_{PD}$.

The quiescent current IDDQ in this circuit model is expressed by Expression 1. Expression 1 is an example of the quiescent current expression. In Expression 1, the first term on the right side represents the normal current $I_L$, and the second and third terms on the right represent the pattern-dependent defect current $I_D$ and the passive defect current $I_{PD}$, respectively.

$$IDDQ = A(l, T) \cdot \exp\left(\frac{V_{gs} - V_{th} + \lambda(Vdd - Vss)}{S/\ln 10}\right) + \frac{(Vdd - Vss)}{R_D} + \frac{(Vdd - Vss)}{R_{PD}} \qquad \text{Expression 1}$$

Here, $A(1, T)$ is a parameter depending on pattern 1 and a temperature T. Furthermore, $V_{gs}$ is a gate-source junction voltage and $V_{th}$ is a threshold voltage of the MOSFET. Yet further, $\lambda$ is a drain-induced-barrier lowering (DIBL) effect caused by an increase in the drain voltage, i.e. Vdd, and represents the dependence of the threshold voltage $V_{th}$ on Vdd. In addition, S is a sub-threshold slope and is expressed by Expression 2. In Expression 2, k is a Boltzmann constant, T is the temperature, q is a unit charge, $C_D$ is a depletion layer capacitance, and $C_{OX}$ is an oxide film capacitance.

$$S = \frac{k \cdot T}{q} \cdot \ln 10 \cdot \left(1 + \frac{C_D}{C_{OX}}\right) \quad \text{Expression 2}$$

If the elements are not miniaturized to a significant degree, the value of λ in Expression 1 is almost zero, so that the normal current $I_L$ does not depend on Vdd. In such a case, the normal current $I_L$ is a constant current source. When substantial miniaturization is achieved, however, λ becomes a significant value, so that the dependence of the normal current $I_L$ on Vdd cannot be ignored. Since the pattern-dependent defect current $I_D$ and the passive defect current $I_{PD}$ caused by a defect or the like are also dependent on Vdd, simply changing Vdd and measuring the IDDQ is insufficient for distinguishing between a normal current and an abnormal current. When the normal current $I_L$ changes according to Vdd, this change is exponential in relation to Vdd, as shown in Expression 1. Therefore, the normal current $I_L$ is an example of the first current term whose value increases exponentially in relation to the voltage applied to the power supply voltage Vdd of the power supply terminal. Since the pattern-dependent defect current $I_D$ and the passive defect current $I_{PD}$, which are the abnormal currents, both change according to Vdd, both of these currents are examples of the second current term whose value increases proportionately with the voltage applied to the power supply voltage Vdd of the power supply terminal.

As described above, it is necessary to separate the normal current from the abnormal current since both are included in the quiescent current IDDQ of Expression 1, but these currents cannot be easily separated since both depend on Vdd. It is however possible to separate these currents because the normal current changes exponentially in relation to Vdd while the abnormal current changes proportionally with Vdd. In other words, Expression 1 is transformed into Expression 3, and the term relating to the normal current is grouped on the right side of the expression. Expression 3 is an example of the quiescent current expression. In Expression 3, the resistance R expresses the parallel resistances $R_D$ and $R_{PD}$.

$$IDDQ - \frac{(Vdd - Vss)}{R} = \quad \text{Expression 3}$$
$$A(l, T) \cdot \exp\left(\frac{V_{gs} - V_{th} + \lambda(Vdd - Vss)}{S/\ln 10}\right)$$

Next, Expression 4 is obtained by taking the natural log of both sides of Expression 3. Expression 4 is an example of the quiescent current expression.

$$\text{Ln}\left(IDDQ - \frac{Vdd - Vss}{R}\right) = \quad \text{Expression 4}$$
$$\text{Ln}(A(l, T)) + \left(\frac{V_{gs} - V_{th} + \lambda(Vdd - Vss)}{S/\ln 10}\right)$$

In the test apparatus 100, the power supply control section 120 controls the power supply section 110 to output a first voltage V1, which is applied to the device under test 200. The current measuring section 130 measures the quiescent current IDDQ1 at this time. The power supply section 110 then changes its output to a second voltage V2, and the current measuring section 130 measures the quiescent current IDDQ2. Next, the power supply section 110 changes its output to a third voltage V3, and the current measuring section 130 measures the quiescent current IDDQ3. The voltage output by the power supply section 110 is adjusted such that V1−V3=2×(V2−V3).

The resistance R can be obtained by inputting the IDDQ1 corresponding to the first voltage V1, the IDDQ2 corresponding to the second voltage V2, and the IDDQ3 corresponding to the third voltage V3 into Expression 4. More specifically, the value of the resistance R can be obtained from a relational expression resulting from the calculation of each of (i) a first expression in which the IDDQ1 corresponding to the first voltage V1 is substituted into Expression 4, (ii) a second expression in which the IDDQ2 corresponding to the second voltage V2 is substituted into Expression 4, and (iii) a third expression in which the IDDQ3 corresponding to the third voltage V3 is substituted into Expression 4. The value of the resistance R can be calculated as described below, for example.

Expression 5 is obtained by subtracting (i) the third expression in which the measured IDDQ3 and V3 are substituted into Expression 4 from (ii) the first expression in which the measured IDDQ1 and V1 are substituted into Expression 4.

$$\text{Ln}\left(\left(IDDQ1 - \frac{V1}{R}\right) \Big/ \left(IDDQ3 - \frac{V3}{R}\right)\right) = \frac{\lambda}{S/\ln 10} \cdot (V1 - V3) \quad \text{Expression 5}$$

Expression 6 is obtained by subtracting (i) the third expression in which the measured IDDQ3 and V3 are substituted into Expression 4 from (ii) the second expression in which the measured IDDQ2 and V2 are substituted into Expression 4.

$$\text{Ln}\left(\left(IDDQ2 - \frac{V2}{R}\right) \Big/ \left(IDDQ3 - \frac{V3}{R}\right)\right) = \frac{\lambda}{S/\ln 10} \cdot (V2 - V3) \quad \text{Expression 6}$$

Expression 7 can be obtained by dividing Expression 6 by Expression 5 since V1−V3=2×(V2−V3). Expression 7 is an example of a relational expression achieved by calculating the first expression, the second expression, and the third expression to eliminate the first current term.

$$\left(IDDQ1 - \frac{V1}{R}\right) \Big/ \left(IDDQ3 - \frac{V3}{R}\right) = \quad \text{Expression 7}$$
$$\left(\left(IDDQ2 - \frac{V2}{R}\right) \Big/ \left(IDDQ3 - \frac{V3}{R}\right)\right)^2$$

The value of the resistance R caused by a defect can be obtained as described above. The device under test 200 is judged to be non-defective if the value of the resistance R is greater than a prescribed value, and is judged to be defective if the value of the resistance R is less than the prescribed value. Even if a leak current dependent on Vdd occurs in a miniaturized normal element, the test apparatus 100 of the present embodiment can distinguish the normal current from the abnormal current with a high degree of accuracy to enable testing of the IDDQ of the device under test 200. Furthermore, the test apparatus 100 can enhance test coverage without enlarging the test patterns.

In the present embodiment, the output voltage is adjusted such that V1−V3=2×(V2−V3), but the method for controlling the output voltage is not limited to such. For example, the output voltage may be controlled such that V1−V3=V2−V3, and the resistance R may be calculated in the same way.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize a "test apparatus and a test method" that provide an IDDQ test in which the normal current can be distinguished from the abnormal current to enable an accurate defectiveness judgment, even if a leak current occurs in an element due to miniaturization.

What is claimed is:

1. A test apparatus that tests a device under test, comprising:
   a power supply section that supplies power to a power supply terminal of the device under test;
   a power supply control section that controls the power supply section to output the power at a plurality of voltage levels;
   a current measuring section that measures, at each voltage level, a current value of a quiescent current of the device under test, the quiescent current being supplied to the power supply terminal of the device under test by the power supply section; and
   an analyzing section that analyzes whether a defect is present in the device under test by using at least three current values from among the current values measured by the current measuring section at the plurality of voltage levels.

2. The test apparatus according to claim 1, further comprising a pattern generating section that generates a pattern supplied to the device under test, wherein
   the current measuring section measures the quiescent current at each voltage level while the device under test is being supplied with the pattern generated by the pattern generating section.

3. The test apparatus according to claim 2, wherein
   the pattern generating section generates a plurality of the patterns, and
   the current measuring section measures the quiescent current for each of the plurality of patterns.

4. A test apparatus that tests a device under test, comprising:
   a power supply section that supplies power to a power supply terminal of the device under test;
   a power supply control section that controls the power supply section to output the power at a plurality of voltage levels;
   a current measuring section that measures, at each voltage level, a current value of a quiescent current of the device under test, the quiescent current being supplied to the power supply terminal of the device under test by the power supply section; and
   an analyzing section that analyzes whether a defect is present in the device under test by using at least three current values from among the current values measured by the current measuring section at the plurality of voltage levels, wherein
   the analyzing section obtains a resistance value related to the defect based on a quiescent current expression including (i) a first current term whose value increases exponentially in relation to an applied voltage, and (ii) a second current term whose value increases proportionally with the applied voltage, the quiescent current expression being a mathematical expression representing the quiescent current supplied to the power supply terminal.

5. The test apparatus according to claim 4, wherein
   the analyzing section obtains the resistance value from a relational expression by using three expressions to eliminate the first current term, the three expressions being (i) a first expression in which a first current value corresponding to a first voltage level is substituted for the quiescent current expression, (ii) a second expression in which a second current value corresponding to a second voltage level is substituted for the quiescent current expression, and (iii) a third expression in which a third current value corresponding to a third voltage level is substituted for the quiescent current expression.

6. A test method for testing a device under test, comprising the steps of:
   applying a first voltage to a power supply terminal of the device under test and obtaining a first current value corresponding to the first voltage by measuring a quiescent current of the device under test supplied to the power supply terminal;
   applying a second voltage to the power supply terminal of the device under test and obtaining a second current value corresponding to the second voltage by measuring the quiescent current of the device under test supplied to the power supply terminal;
   applying a third voltage to the power supply terminal of the device under test and obtaining a third current value corresponding to the third voltage by measuring the quiescent current of the device under test supplied to the power supply terminal; and
   analyzing whether a defect is present in the device under test by using the first current value, the second current value, and the third current value.

7. The test method according to claim 6, wherein
   said analyzing includes obtaining a resistance value related to the defect based on a quiescent current expression including (i) a first current term whose value increases exponentially in relation to an applied voltage, and (ii) a second current term whose value increases proportionally with the applied voltage, the quiescent current expression being a mathematical expression representing the quiescent current supplied to the power supply terminal.

* * * * *